(12) United States Patent
Vollmar (10) Patent No.: US 9,090,968 B2
(45) Date of Patent: Jul. 28, 2015

(54) APPARATUS AND METHOD FOR SUPPLYING ELECTRIC POWER TO A CVD-REACTOR

(75) Inventor: Wilfried Vollmar, Soest (DE)

(73) Assignee: SITEC GMBH, Burghausen (DE)

(*) Notice: Subject to any disclaimer, the term of this patent is extended or adjusted under 35 U.S.C. 154(b) by 236 days.

(21) Appl. No.: 13/639,534

(22) PCT Filed: May 17, 2011

(86) PCT No.: PCT/EP2011/002449
§ 371 (c)(1),
(2), (4) Date: May 29, 2013

(87) PCT Pub. No.: WO2011/144324
PCT Pub. Date: Nov. 24, 2011

(65) Prior Publication Data
US 2013/0273265 A1    Oct. 17, 2013

(30) Foreign Application Priority Data

May 17, 2010  (DE) .......................... 10 2010 020 740

(51) Int. Cl.
C23C 16/24    (2006.01)
C01B 33/035   (2006.01)
C23C 16/44    (2006.01)

(52) U.S. Cl.
CPC ............... *C23C 16/24* (2013.01); *C01B 33/035* (2013.01); *C23C 16/4418* (2013.01)

(58) Field of Classification Search
None
See application file for complete search history.

(56) References Cited

U.S. PATENT DOCUMENTS 3,941,900 A * 3/1976 Stut et al. ...................... 423/349
2011/0169332 A1* 7/2011 Wallmeier ...................... 307/31

* cited by examiner

*Primary Examiner* — Joseph Miller, Jr.
(74) *Attorney, Agent, or Firm* — Tarolli, Sundheim, Covell & Tummino LLP (57) ABSTRACT

An apparatus and method for applying a voltage across silicon rods in a CVD reactor has a series connection wherein the silicon rods may be inserted as resistors A first power supply unit has first transformers connected with one silicon rod. A second power supply unit has second transformers connected to the same number of silicon rods as the first transformers in parallel to one or more of the first transformers. The second transformers have an open circuit voltage lower than the first transformers and a short circuit current higher than the first transformers. A third power supply unit has outputs connected with the silicon rods in parallel to the first and second transformers. The third power supply unit is capable of providing a current in a voltage range below the open circuit voltage of the second transformer and higher than the short circuit current of the second transformer.

6 Claims, 6 Drawing Sheets

APPARATUS AND METHOD FOR SUPPLYING ELECTRIC POWER TO A CVD-REACTOR

The present invention relates to a method and an apparatus for applying a voltage across a plurality of silicon rods in a CVD-reactor which silicon rods are connected in series.

It is known in the semiconductor technology and the photovoltaic industry to produce silicon rods having high purity, e.g. in accordance with the Siemens method in deposition reactors, which are also referred to as CVD-reactors (CVD=chemical vapour deposition). In this process, initially thin silicon rods are received in the reactors, onto which silicon is deposited during a deposition process. The thin silicon rods are received in clamping and contacting apparatuses, which hold the thin silicon rods in a desired orientation and which also provide electrical contacting thereof. At their respective free ends, the thin silicon rods are typically connected via electrically conducting ridges, in order to allow closing of an electrical circuit via contact elements, which are arranged on the same side of the reactor. Alternatively, it is also possible to contact the thin silicon rods are their opposite ends, i.e. from above and from below, in order to enable conducting a current through the thin silicon rods. A pair of thin silicon rods, which is connected via an electrically conducting bridge, as well as thin silicon rods, which are contacted at their opposite ends, are referred to as silicon rod for reasons for simplicity.

The silicon rods are heated to a predetermined temperature, at which deposition of silicon from the vapour or gas phase onto the silicon rods occurs. Heating is achieved during the process by a flow of current at a substantially predetermined voltage by means of resistance heating. The deposition temperature is typically in the range of 900-1350 degree Celsius and in particular, at about 1100 degrees Celsius, but may also be at other temperatures.

Since the silicon rods initially have a high resistance, which lowers at higher temperatures, it is necessary to first apply a high initial voltage across the silicon rods, in order to initiate an initial flow of current, which is also referred to as igniting the silicon rods. After initial heating of the silicon rods by the flow of current and thereby reducing the resistance of the silicon rods, the voltage applied across the silicon rods can be reduced to an operating voltage. Further temperature regulation of the silicon rods can be primarily controlled via the current.

DE 10 2009 021 403 A describes an apparatus and a method for a two-step application of voltage for thin silicon rods in a CVD-reactor. In particular, in the apparatus described, a first supply unit having a plurality of transformers is provided, wherein each transformer supplies a voltage to a respective pair of the thin silicon rods during a start phase. Furthermore, a second supply unit is provided, which is capable of supplying pairs of serially connected thin silicon rods during an operating phase with a voltage. The transformers of the first supply unit are connected with a three-phase supply network on their primary side. Furthermore, between each transformer and the three-phase supply network, a choke and a power regulator in the form of a bidirectional thyristor power regulator are provided. The power regulators are operable for adjusting and maintaining a voltage level on the secondary side of the respective transformers and also for limiting the flow of current therethrough. The power regulators are specially used to counteract a decrease of the voltage at increased current flow, which typically occurs in transformers, by maintaining the voltage level at the secondary side. Such power regulators, however, are expensive and require a respective control, which leads to involved controlled electronics.

It is therefore an object of the present invention to provide an apparatus and a method for applying a voltage across a plurality of silicon rods in a CVD-reactor which provide, in an easy and cost effective manner, a multi-step voltage supply in accordance with respective requirements.

In accordance with the present invention, the object is solved by an apparatus according to claim 1 and a method according to claim 9. Further embodiments of the invention are disclosed in the dependent claims.

The apparatus, in particular comprises a series connection in which the silicon rods may be inserted as resistors, at least one first current supply unit, at least one second current supply unit, at least one third current supply unit and at least one control unit, which is capable of applying a voltage across the silicon rods in the series connection via the first, the second or the third supply unit. The respective current supply units are preferably transformers and, in particular preferably transformers for transforming single phase line voltages, which have a plurality of inputs on their primary side for supplying at least one external line voltage and on their secondary side, a plurality of outputs for applying the at least one transformed line voltage with ohmic and/or inductive loads. Under a plurality of inputs/outputs in the following one or more inputs/outputs are to be understood. The first current supply unit comprises a plurality of first transformers, the outputs of which are each serially connected to at least one silicon rod, wherein the first transformers have a first open circuit voltage and a first short circuit current. The second current supply unit comprises a plurality of second transformers, the outputs of which are connected in series with at least the same number of silicon rods as the first transformers and which may be arranged parallel to one or more the first transformers, wherein the second transformers have a second open circuit voltage and a second short circuit current and wherein the second open circuit voltage is lower than the first open circuit voltage and wherein the short circuit current is higher than the first short circuit current. The third current supply unit comprises outputs which are connected with the series of silicon rods and may be arranged parallel to the first and second transformers, wherein the third current supply unit is capable of providing a current at a voltage which is below the open circuit voltage of the second transformer, the current being larger than the short circuit current of the second transformers. Such an apparatus enables in an easy manner, a multi-step application of different voltages across the silicon rods. By providing different transformers in the first and second power supply units, which may selectively apply voltages to the silicon rods under control of the control unit, in combination with the third current supply unit, it is possible to omit for example, power regulators and a corresponding control electronics on the primary side of transformers. Furthermore, more simple transformers may be used.

Preferably, the second transformers are each connected in series to a larger number of silicon rods than the first transformers are connected to. In so doing, the number of transformers in the second current supply unit may be reduced over the number of transformers in the first current supply unit, which may lead to a reduction of cost and/or space for the second current supply unit. In particular, the second transformers are each connected in series to twice the number of silicon rods compared to the number of the first transformers. In so doing, the number of transformers in the second current supply unit is halved. Furthermore, the outputs of the third current supply unit are preferably connected in series to at least twice the number of silicon rods compared to the second transformers. In so doing, there is an increasing serial connection of the silicon rods.

For simplifying the required shielding or safety techniques, the first and/or second transformers, which are connected in series with adjacent silicon rods, are oppositely wound. This allows that the outer ends of the silicon rods in the series are respectively at one potential, the absolute value of which is the lowest and is preferably around zero volt.

In one embodiment of the invention, at least a fourth power supply unit is provided comprising at least one fourth transformer, the outputs of which are connected in series to more silicon rods than the outputs of the respective second transformers, and said fourth transformer having a fourth open circuit voltage, which is lower than the second open circuit voltage, and a fourth short circuit current, which is higher than the second short circuit current. In this case, the at least one control unit is capable of alternatively applying a voltage to the silicon rods in the series connection also via the fourth current supply unit, and the third current supply unit is capable of providing a current which is larger than the fourth short circuit current at a voltage which is below the fourth open circuit voltage. The fourth current supply unit provides further increments of the voltage supply for the silicon rods, thereby, the third voltage supply may provide a lower maximum voltage level, which may reduce the cost for the overall apparatus.

Preferably, the transformers of the first power supply unit have a steeper current/voltage characteristic than the transformers of the second power supply unit, and the transformers of the second power supply unit have a steeper current/voltage characteristic than the third power supply unit. In so doing, it is easy to adjust to a temperature dependent resistance change of the silicon rods. The specific resistance of the silicon rods initially decreases steeply as the temperature increases and then goes into a saturation state. The different current/voltage characteristics of the power supply unit reflects this trend in the different gradients.

In order to avoid overloading the transformers of the first and second power supply unit, the control unit is capable of switching to a different power supply unit depending on a flow of current through the respective first and second transformers. This enables, in a simple manner, a switching between different voltages in accordance with the requirements at the time.

In the method according to the invention, the steps mentioned herein below are carried out sequentially. First, a first voltage is applied across the silicon rods via a plurality of first transformers. The term first voltage refers to an average effective value of the voltage, which is averaged over the time during which the current is applied via the first transformers. Subsequently, a second voltage is applied across the silicon rods via the plurality of second transformers, wherein the second voltage is lower than the first voltage. The term second voltage refers to an average effective value of the voltage, which is averaged over the time during which the voltage is applied via the second transformers. With an increase in temperature in the silicon rods which is caused by a current flow initiated by the first and/or second voltage, the respective voltage may decrease over time, while at the same time, the current flow increases. Finally, a third voltage is applied to the silicon rods using a power supply unit, wherein the third voltage is lower than the second voltage. The term third voltage refers to an average effective value of the voltage which is averaged over the time during which the voltage is applied via the power supply unit. Again, with an increase in temperature of the silicon rods, the voltage may decrease over time while the current may further increase. The method allows the above mentioned advantages of a simple and multistep application of voltage across silicon rods in a CVD reactor.

Preferably, the third voltage is applied across all of the silicon rods which are connected in series, while the first and/or second voltage is applied across a single silicon rod or groups of silicon rods. The first voltage may be applied across each single silicon rod and the second voltage may be applied across two silicon rods which are connected in series. In so doing, a step-wise increase in the series connection of silicon rods is achieved.

In order to avoid overloading the first and second transformers, the current flow through the silicon rods is determined and at least one switch between different voltages may be controlled in accordance with the thus determined current flow. The position reactors may have a different number of silicon rods which are connected in series. The circuit disrupt path may be used several times in a single reactor.

In accordance with one embodiment of the invention, a force voltage is applied across the silicon rods after applying the second voltage and before applying the third voltage, wherein the fourth voltage is applied by at least one third transformer and may be between the second and third voltages. The term fourth voltage refers to an average effective value of the voltage, which is averaged over the time at which the voltage is applied via the at least one third transformer.

When applying the first and/or the second voltage via the first and second transformers, respectively, the voltage is applied in such a manner, that at the ends of the series connection, the voltage level is the lowest in absolute value. In so doing, the required insulation or safety technique may be simplified.

The invention will be described herein below in more detail, taking reference to the drawings.

In the drawings.

Figure 1:
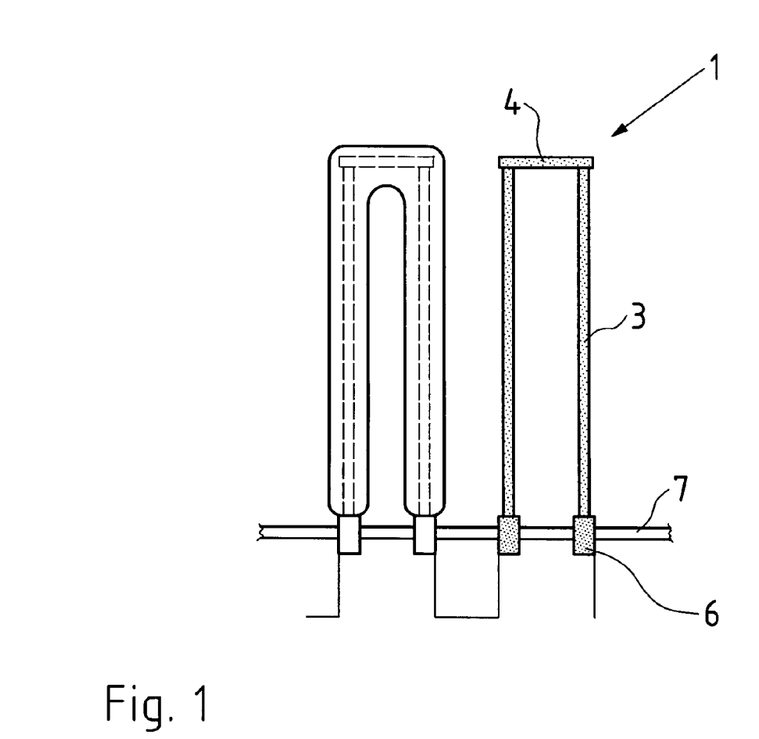
FIG. 1 is a schematic side view of an arrangement of silicon rod pairs in a CVD reactor with and without silicon being deposited thereon.

FIG. 1 shows a schematic side view of an arrangement of silicon rod pairs 1 in a CVD reactor which is not shown in detail. In order to simplify the representation, only two rod pairs 1 are shown in one plan standing next to each other. It is noted, however, that in a CVD reactor, more such rod pairs 1 may be received which are not oriented with respect to each other in one plane. Typically, four to twenty four of such rod pairs 1 are provided in a CVD reactor while obviously, more or less rod pairs 1 may be provided.

FIG. 1 shows two rod pairs 1 which each consist of two thin silicon rods 3 and a connecting bridge 4. The right rod pair in FIG. 1 shows the initial configuration prior to a gas phase deposition. The left rod pair shows the configuration after a gas phase deposition of silicon on the thin silicon rods, which are still indicated in the left rod pair by a dashed line.

The thin silicon rods are each arranged in a known manner in electrode arrangements 6 at the floor 7 of the CVD reactor. The connecting bridge 4 of the rod pairs 1 connects the free ends of the thin silicon rods 3. The connecting rods 4 also consist of silicon and preferably have the same electrical characteristics as the thin silicon rods 3. In particular, the connecting bridges 4 may be manufactured from thin silicon rods and may be connected in any appropriate manner to the free ends of the silicon rods 3 in the arrangement shown in FIG. 1.

Such an arrangement of rod pairs 1 allows electrical contact of the thin silicon rods 3 exclusively via the electrode arrangement 6 at the floor 7 of the CVD reactor. In the following, for simplification of the description, both silicon rod pairs 1 in accordance with FIG. 1 as well as single thin silicon rods which are connected at both ends with the electrodes, are referred to as silicon rods.

Figure 2:
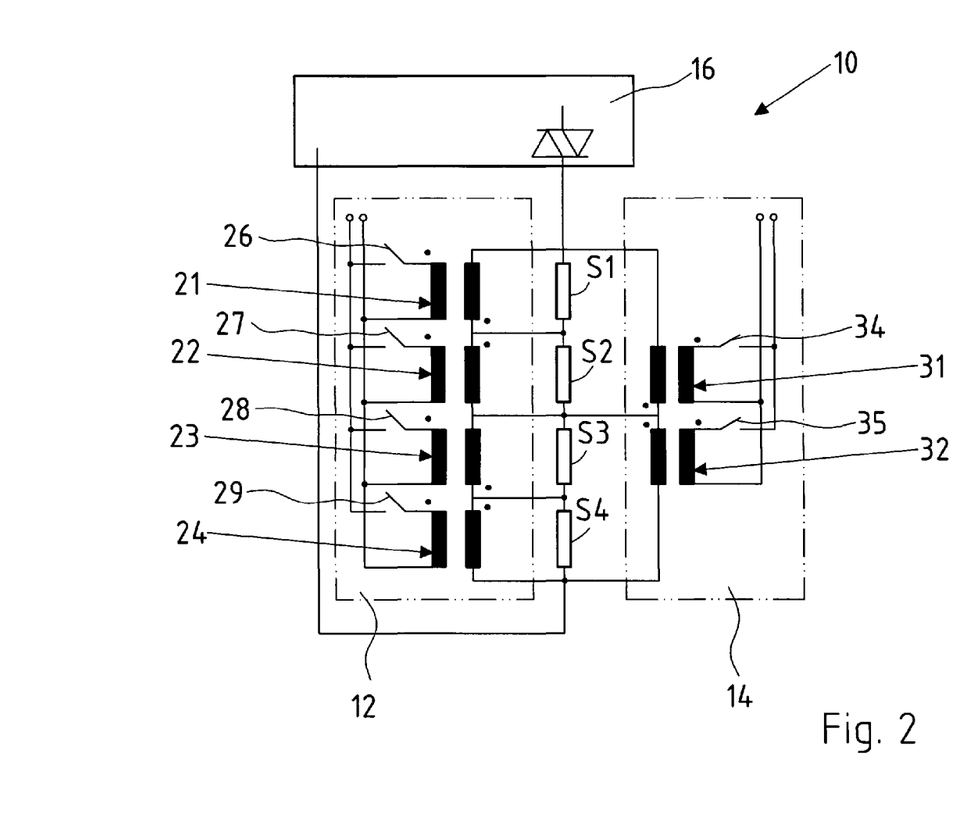
FIG. 2 is a schematic circuit arrangement for applying different voltages to silicon rods in a CVD reactor.

FIG. 2 shows a schematic circuit arrangement 10 for applying different voltages across silicon rods S1 to S4, which may be received in a CVD reactor (not shown) and the manner shown in FIG. 1.

The circuit arrangement 10 in accordance with FIG. 2 is designed for four silicon rods S1 to S4, but it may also be provided for a different number, wherein four of an integer multiple thereof is currently the preferred number of silicon rods for a circuit arrangement 10. Depending on the number of silicon rods in a CVD reactor, a corresponding number of circuit arrangements 10 may be provided. The silicon rods S1 to S4 are electrically connected in series. The circuit arrangement 10 has a first power supply unit 12, a second power supply unit 14, a third power supply unit 16 and a control unit which is not shown.

Figure 3:
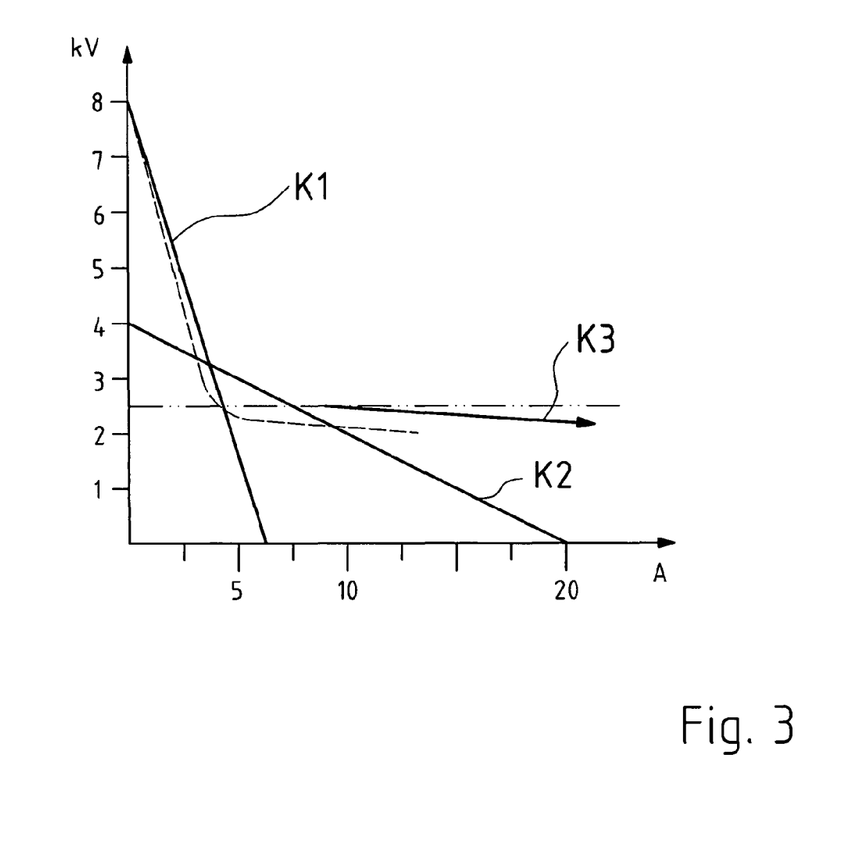
FIG. 3 is current/voltage characteristics of different current supply units shown in FIG. 2 and furthermore, a typical current/voltage characteristic of a silicon rod in a CVD reactor prior to the deposition of silicon is schematically shown.

The first power supply unit 12 has altogether four transformers 21-24 which may be connected on their primary side via respective switches 26-29 to a one phase alternating voltage of for example, 400 Volts. The transformers 21-24 have, on their secondary side, an open circuit voltage of approximately 8,000 Volts and a short circuit current of approximately 6 Amperes. In FIG. 3, a current/voltage characteristic K1 of the transformers 21-24 is shown. As shown, the transformers 21-24 each have a steep gradient of the current/voltage characteristic, i.e. the voltage on the secondary side quickly decreases when the flow of current increases.

Each of the transformers 21-24 is assigned to one of the silicon rods S1-S4 and the outputs at the secondary side of the transformers 21-24 are each connected to opposite ends of one of the silicon rods S1-S4. Thus, each of the transformers 21-24 is capable of applying a voltage of 8,000 Volts across a respective one of the silicon rods S1-S4 in the series connection. The secondary windings of the transformers 21, 23 are oppositely wound to the secondary windings of the transformers 22, 24, such that transformers 22, 24 having the primary and secondary side wound in the same direction alternate with the transformers 21, 23 which have their primary and secondary sides wound oppositely with respect to the row of adjacent silicon rods. In particular, the transformers 21-24 are wound in such a manner and connected to the silicon rods S1-S4 such that the outer ends of the silicon rods S1-S4 which are connected in series are at the lowest level with respect to the absolute value and are in particular at approximately 0 Volts when voltage is applied across the silicon rods S1-S4 via the transformers 21-24.

The second power supply unit 14 has two transformers 31, 32, which may be connected via respective switches 34, 35 to a one phase alternating voltage of for example, 400 Volts on their primary side. The transformers 31, 32 as shown each have an open circuit voltage of 4,000 Volts and a short circuit current of 20 Amperes on their secondary side. In FIG. 3, a current/voltage characteristic K2 of the transformers 31, 32 is shown. As shown, the transformers 31, 32 have a less steep gradient of the current/voltage characteristic compared to the transformers 21-24 of the first power supply unit 12.

Each of the transformers 31, 32 is assigned to two adjacent ones of the silicon rods S1-S4 and the outputs at the secondary side of the transformers 31, 32 are each connected to the opposite ends of the group of two adjacent ones of the silicon rods S1-S4 which are connected in series. Thus, each of the transformers 31, 32 is capable of applying a voltage of approximately 2,000 Volts across a respective one of the silicon rods S1-S4 in the series connection (the silicon rods connected in series act in substance as a voltage divider). The secondary sides of the transformers 31, 32 are oppositely wound. In particular, the transformers 31, 32 are wound in such a manner and connected to the silicon rods S1-S4 such that the outer ends of the silicon rods S1-S4 of the series connection are each at the lowest level in absolute value and are in particular at approximately 0 Volts when a voltage is applied across the silicon rods S1-S4 via the transformers 31, 32.

The third power supply unit 16 is any regulated current supply, which is capable of providing a voltage in a range below the open circuit voltage of the transformers 31, 32 of the second current supply unit and a current flow above the short circuit of the transformers 31, 32 of the second power supply unit 14. In the embodiment as shown, the third power supply unit 16 is for example capable of providing a voltage at its outputs between 2,500-50 volt and a current of 10-3,400 Amperes. In FIG. 3, the current/voltage characteristic K3 of the third power supply unit 16 is shown. As shown, the third power supply unit has a less steep gradient than the current/voltage characteristic of the transformers of the second power supply unit 14.

The third power supply is connected to the silicon rods S1, S2, S3, S4 which are connected in series such that the voltage drops along the row of silicon rods S1-S4 which are connected in series, i.e. it is connected to the outer ends of the silicon rods S1 and S4 of the silicon rods connected in series.

The control device, which is not shown, is capable of selectively and sequentially applying a voltage across the silicon rods S1-S4 via the first, second or third power supply unit 12, 14, 16. In so doing, the respective transformers 21-24 of the first power supply unit 12 and the transformers 31, 32 of the second power supply unit 14 may be switched on and switched off individually, in groups or altogether, as is shown by the respective switches 26-29 and 35, 36.

The transformers 21, 22, 23, 24, 34 and 35 of the power supply units 12, 14 each have a "soft" characteristic and they may each be of the type having separate or internal choke, an air gap or a transductor. The power supply 16 adjusts the voltage and the current to the changing conditions during the deposition process.

In the following, operation of the circuit arrangement 10 during a CVD deposition process will be explained in more detail, wherein the description is limited to the four silicon rods, S1-S4 according to FIG. 2. At the beginning of the process, all power supply units 12, 14, 16 are switched off. Subsequently, the first power supply unit 12 is actuated via the control unit to close switches 26-29. A voltage of up to 8,000 Volts is then applied across the individual silicon rods S1-S4 via the transformers 21-24. Due to the high voltage, despite the high initial resistance of the silicon rods S1-S4, a current flow occurs within the silicon rods S1-S4. Due to this current flow, there will be heating of the silicon rods S1-S4, which leads to a reduction of the resistance thereof. The increased current flow due to the reduced resistance within the silicon rods S1-S4 then leads to a reduction of the voltage applied via the transformers as shown in the characteristic K1 in FIG. 3. In FIG. 3, it is also schematically shown by a dashed line, a graph for the current/voltage characteristic of a thin silicon rod pair as it is used in the CVD reactor for silicon deposition at the beginning of the silicon deposition. As can be shown by this graph, a very high initial voltage is required in order to initiate an initial current flow which is capable of affecting a sufficiently high temperature increase in the thin silicon rod pair which may lead to a significant lowering of the resistance of the thin silicon rod pair. At the beginning of the process, the initial voltage is therefore high and the initial current is very low. Alternatively, the silicon rods may also first be heated using for example, IR emitters, halogen lamps or other means for heating silicon to an initial temperature which is high enough that, at an applied initial voltage, an initial current may flow, which is high enough to achieve further heating of the silicon rod. The initial voltage first drops at a first steep gradient when there is an increase in temperature and the initial current increases correspondingly. In the further course, the graph becomes flatter and slowly approaches a saturation value, the resistance of the thin silicon thin rod pair is further reduced, the current flowing through the silicon increases since the temperature of the silicon increases and the deposition process starts.

The current/voltage characteristic K1 of the transformers 21-24 is adjusted to the temperature dependent resistance change of the silicon rods S1-S4 such that the voltage drops at a steep gradient with an increased current flow in order to avoid uncontrolled heating of the silicon rods in the start phase.

If the current flow through the silicon rods S1-S4 reaches a certain level of for example, 4-5 Amperes due to the reduction of resistance of the silicon rods, the switches 26-29 of the first power supply unit 12 are opened and the switches 35, 36 of the second power supply unit 14 are closed. A voltage of up to 4,000 Volts is then applied across pairs S1, S2; S3, S4 of the silicon rods via the transformers 31, 32, wherein a maximum voltage of approximately 2,000 volts is applied across each individual silicon rod S1-S4.

The current flow through the silicon rods S1-S4 increases as the temperature of the silicon rods increases and the resistance is further reduced. The current/voltage characteristic K2 of the transformers 31, 32 is more flat, corresponding to the current/voltage characteristic of the silicon rods, compared to the current/voltage characteristic of the transformers 21-24. The transformers 31, 32 are capable of providing a higher current compared to transformers 21, 22, 23, 24.

As the current flow through the silicon rods S1-S4 reaches a third level of for example, 10-12 Amperes due to the reduction of resistance of the silicon rods, the switches 35, 36 of the second power supply unit 14 are opened and the third power supply unit 16 is switched on in order to apply a voltage across all of the silicon rods S1-S4 connected in series. At this point in time, ignition of the silicon rods S1-S4 is finished, i.e. the silicon rods have a temperature which is high enough such that further temperature increases may be adjusted in substance via current regulation. Accordingly, the current/voltage characteristic K3 of the third power supply unit is substantially more flat than the one of the transformers 31, 32 of the second power supply unit.

After the silicon rods have obtained a sufficiently high temperature, the deposition of silicon on the silicon rods S1-S4 start within the CVD reactor. The silicon now continuously grows onto the rods until they have reached a predetermined thickness. At this point in time, the third power supply unit is switched off. The silicon rods S1-S4 are no longer heated via a current flow and thus, cooled down and may then be taken from the CVD reactor and may be fed to another device for further processing.

The above given number of silicon rods and the corresponding number of transformers of the first and second power supply units are only given as an example and should not be seen in a limiting manner even though they are currently taken into consideration for a CVD reactor having an integer multiple of four silicon rods. Furthermore, the cited open circuit voltages and short circuit currents of the transformers are only given as examples by the fact that they are actually taken into consideration for use in a CVD reactor for igniting silicon rods and are indeed appropriate to do so.

Figure 4:
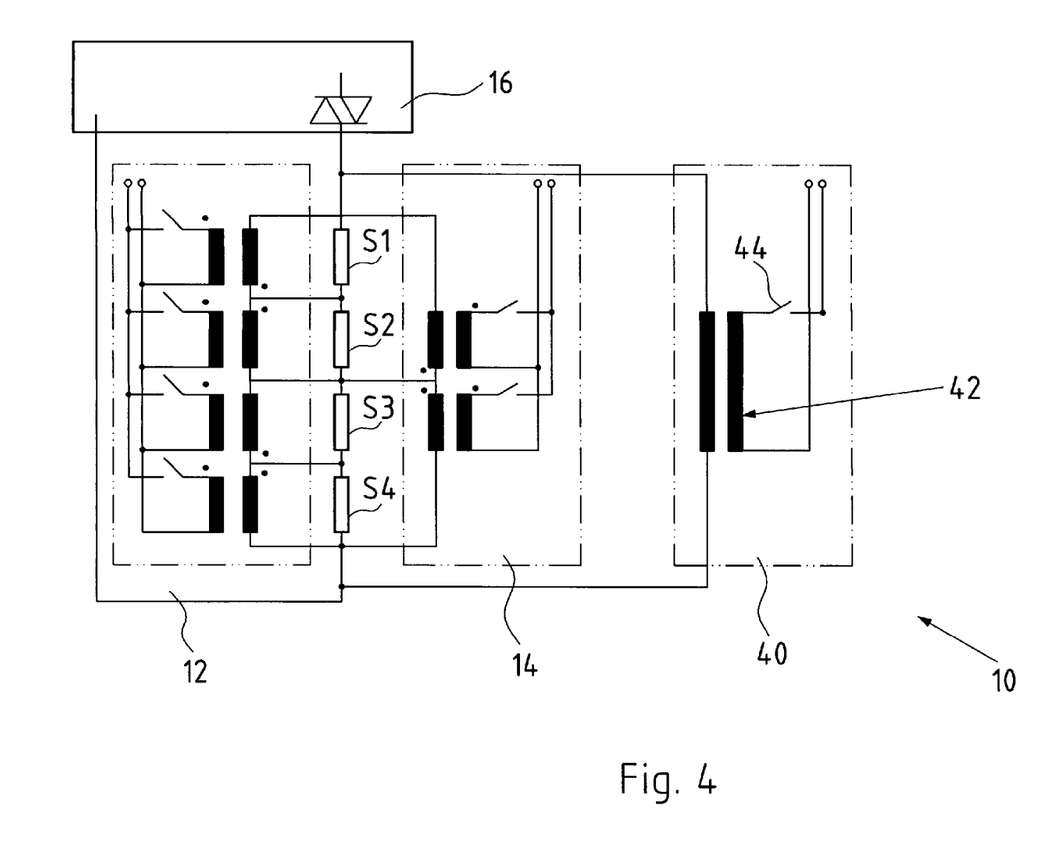
FIG. 4 is a schematic circuit arrangement for applying different voltages to silicon rods in a CVD reactor according to an alternative embodiment.

FIG. 4 shows a schematic circuit arrangement 10 for applying different voltages to silicon rods S1-S4 in accordance with an alternative embodiment. In FIG. 4, the same reference signs are used as in FIG. 2 inasmuch as the same or similar elements are described.

Figure 5:
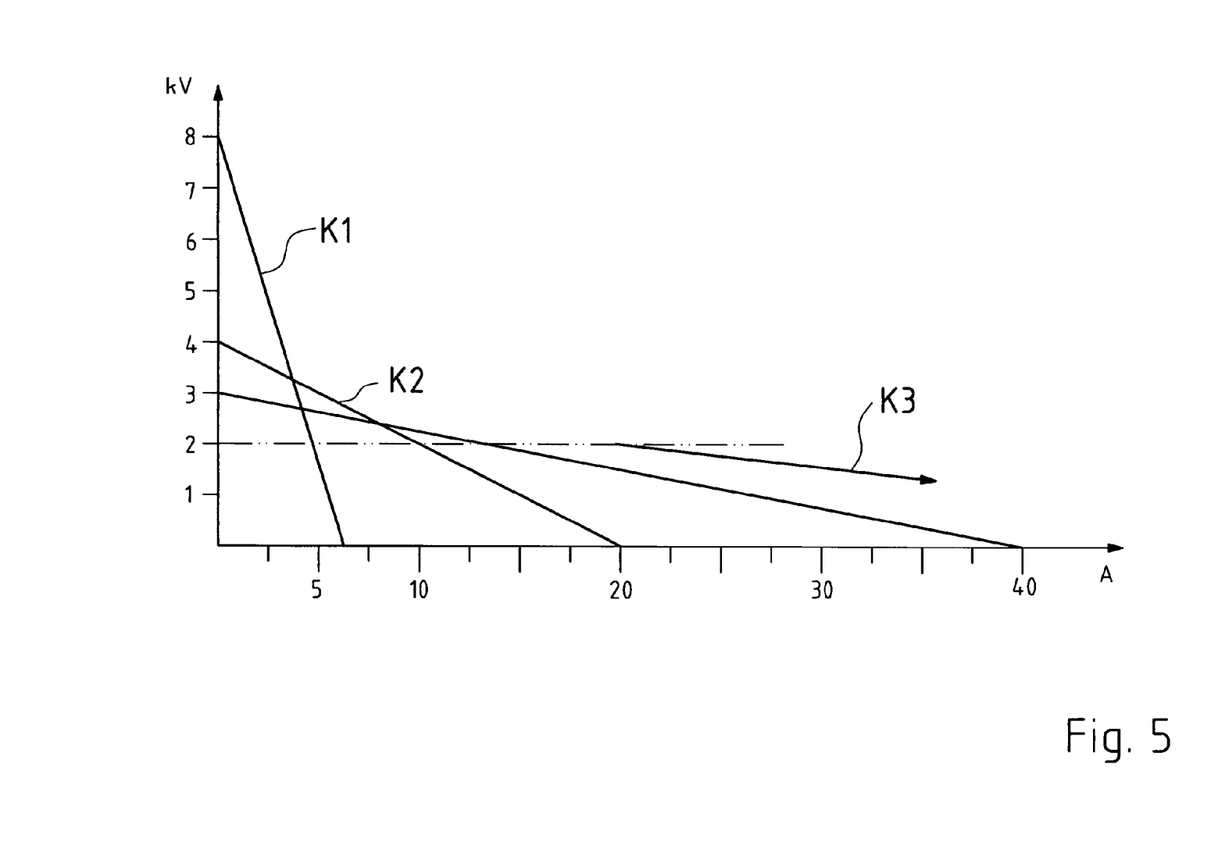
FIG. 5 is a current/voltage characteristic of different current supply units as shown in FIG. 4.

The circuit arrangement 10 according to FIG. 4 has a first power supply unit 12, a second power supply unit 14, a third power supply unit 16 and a control unit which is not shown. These are in substance the same as the previously described units wherein the third power supply unit may provide a lower voltage range of for example, 2,000-50 Volts and a current between 20-3,000 Amperes. Additionally, however, a fourth power supply unit 40 is provided. The fourth power supply unit 40 has a transformer 42 which may be connected on its primary side via a switch 44 to a one face alternating voltage of for example, 400 Volts. The transformers as shown have an open circuit voltage of 3,000 Volts and a short circuit current of 40 Amperes on its secondary side. In FIG. 5, a current/voltage characteristic K4 of the transformer 42 is shown. FIG. 5 also shows the corresponding current/voltage characteristics K1-K3 of the first to third power supply units. As shown, the current/voltage characteristic K4 of the transformer 42 has a less steep gradient compared to the current/voltage characteristic K2 of the transformers 31, 32 of the second power supply unit 14. The current/voltage characteristic K4, however, has a steeper gradient than the current/voltage characteristic K3 of the third power supply unit 16.

Despite the fact that the fourth power supply unit 40 is shown as comprising a single transformer 42, it is noted that similar to the second power supply unit 14, two transformers may be provided which may, for example, have an open circuit voltage of 1,500 Volts and a short circuit current of 40 Amperes. The solution of having a single transformer, however, is preferable due to cost and space reasons. Such a transformer may be provided with a center tap.

Operation of the circuit arrangement according to FIG. 4 is substantially the same as the one described above, wherein after switching off the second power supply unit 14, the fourth power supply unit 40 is switched on until a predetermined current flow of for example, 20-25 Amperes through the silicon rods S1-S4 is achieved. Then, it is switched to the third power supply unit 16.

Figure 6:
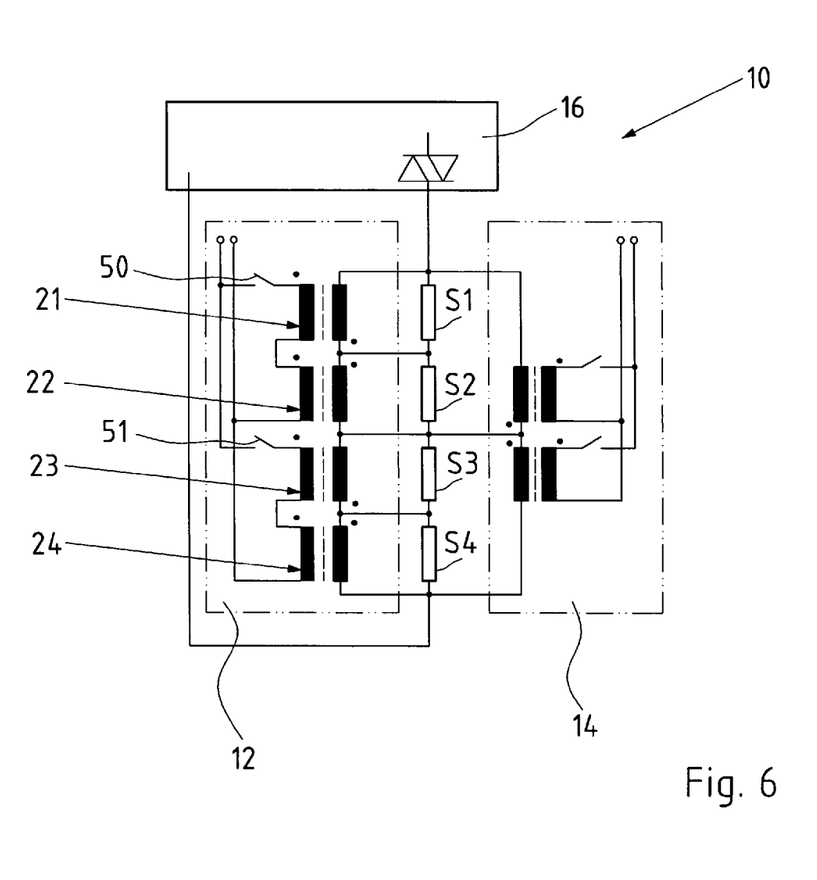
FIG. 6 is a schematic circuit arrangement for applying different voltages to silicon rods in a CVD reactor according to another embodiment.

FIG. 6 shows a schematic circuit arrangement 10 for applying different voltages to silicon rods S1-S4 in accordance with another embodiment. In FIG. 6, the same reference signs are used as in FIG. 2 inasmuch as the same or similar elements are describes.

The circuit arrangement 10 according to FIG. 6 has a first current supply unit 12, a second current supply unit 14, a third current supply unit 16 and a control unit which is not shown. These units are the same as the ones described with respect to FIG. 2.

However, the embodiment of FIG. 6 differs in that transformers 21 and 22 of the first current supply unit 12 are connected in series and may be connected on their primary side via a common switch 50 to the one phase alternating voltage of for example, 400 volts. Similarly transformers 23 and 24 of the first current supply unit 12 are connected in series and may be connected on their primary side via a common switch 51 to the one phase alternating voltage of for example, 400 volts.

Operation of the circuit arrangement according to FIG. 6 is substantially the same as the one described above, wherein obviously transformers 21 and 22 on the one hand and 23 and 24 on the other hand are switched on and off by a common switch. Such a series connection is particularly useful when voltages above 8000V are applied the silicon rods S1 to S4 via the transistors 21 to 24. When one of the silicon rods in the series connection ignites earlier than another one, the voltage may be pulled up when the transformers are connected in series. When the transformers are connected in parallel, the voltage may be limited.

The invention has been described herein above with reference to preferred embodiments without being limited to the specific embodiments. In particular, the invention is not limited to the numerical values given with respect to the number of elements as well as the voltage and current values.

The invention claimed is:

1. An apparatus for applying a voltage across a plurality of silicon rods in a CVD reactor, said apparatus comprising: a series connection in which the silicon rods are inserted as resistors; at least one first power supply unit; at least one second power supply unit; at least one third power supply unit; and at least one control unit which is capable of applying a voltage across the silicon rods at least one control unit which is capable of applying a voltage across the silicon rods in the series connection via the first, the second or the third power supply unit, wherein the first power supply unit comprises a plurality of first transformers, the outputs of which are each connected with one silicon rod in the series connection and wherein the first transformers have a first open circuit voltage and a first short circuit current, wherein the second power supply unit comprises a plurality of second transformers, the outputs of which are connected to the same number of silicon rods as the first transformers in the series connection, in parallel to one or more of the first transformers and wherein the second transformers have a second open circuit voltage and a second short circuit current, wherein the second open circuit voltage is lower than the first open circuit voltage and the second short circuit current is higher than the first short circuit current, wherein the third power supply unit comprises outputs which are connected with the silicon rods in the series connection in parallel to the first and second transformers and wherein the third power supply unit is capable of providing a current in a voltage range which is below the open circuit voltage of the second transformer, which current is higher than the short circuit current of the second transformer, wherein the first power supply unit has a steeper current/voltage characteristic than the second power supply unit and the second power supply unit has a steeper current/voltage characteristic than the third power supply unit, wherein the second transformers are connected to a larger number of silicon rods in the series connection than the first transformers, wherein the second transformers are each connected to twice the number of silicon rods in the series connection as the first transformers; and wherein the outputs of the third power supply unit are connected to at least twice the number of silicon rods as the second transformers.

2. The apparatus according to claim 1, wherein at least one of the first transformers and the second transformers, which are connected to adjacent silicon rods in the series connection, are oppositely wound.

3. The apparatus according to claim 1, wherein at least one fourth power supply unit which comprises at least one fourth transformer, the outputs of which are connected to more silicon rods in a series connection than the outputs of the corresponding second transformers and which has a fourth open circuit voltage and a fourth short circuit current, wherein the fourth open circuit voltage is lower than the second open circuit voltage and the fourth short circuit current is higher than the second short circuit current, wherein the at least one control unit is capable of applying a voltage to the silicon rods in the series connection also via the fourth power supply unit, wherein the third current supply unit is capable of providing a current which is larger than the fourth short circuit current at a voltage range which is below the fourth open circuit voltage.

4. The apparatus according to claim 1, wherein at least two adjacent transformers of the first current supply unit are grouped together and connected in series.

5. The apparatus according to claim 1, wherein the control unit is capable of switching between the power supply units depending on the current flow through the respective first or second transformers.

6. The apparatus according to claim 1, further comprising separate means for heating the silicon rods.

* * * * *